United States Patent [19]
Yamanaka

[11] Patent Number: 5,834,797
[45] Date of Patent: Nov. 10, 1998

[54] TRANSISTOR HAVING FIRST AND SECOND GATE ELECTRODES

[75] Inventor: Hideo Yamanaka, Kanagawa, Japan

[73] Assignee: Sony Corporation, Tokyo, Japan

[21] Appl. No.: 754,272

[22] Filed: Nov. 20, 1996

[30] Foreign Application Priority Data

Nov. 21, 1995 [JP] Japan .................................... 7-302534

[51] Int. Cl.⁶ ................................................. H01L 29/04
[52] U.S. Cl. ................................ 257/57; 257/59; 257/72; 257/347; 349/43
[58] Field of Search ............................... 257/59, 72, 347, 257/57; 349/42, 43, 44, 46

[56] References Cited

U.S. PATENT DOCUMENTS 5,434,433  7/1995  Takasu et al. ............................ 257/59
5,475,238  12/1995  Hamada ..................................... 257/66

*Primary Examiner*—Minh-Loan Tran
*Attorney, Agent, or Firm*—Hill & Simpson

[57] ABSTRACT

The present invention provide a semiconductor device having a first insulating layer provided in contact with a side of an active layer in the direction of thickness thereof, a second insulating layer provided in contact with the other side of the active layer in the direction of the thickness thereof, a first gate electrode for applying a predetermined voltage to the active layer through the first insulating layer, and a second gate electrode for applying a predetermined voltage to the active layer through the second insulating layer. In the semiconductor device, a leak current between the drain and the source is suppressed, thereby obtaining a large driving current.

5 Claims, 13 Drawing Sheets

LASER BEAM IRRADIATION

TRANSISTOR HAVING FIRST AND SECOND GATE ELECTRODES

BACKGROUND OF THE INVENTION

1. Field of the Invention

The present invention relates to a thin film semiconductor device, a manufacturing method therefor and a liquid crystal driving apparatus comprising the semiconductor device.

2. Description of the Related Art

A method of producing a polycrystalline silicon thin film by heat treatment at a high temperature of about 1000° C. has recently been developed, and such a thin film has been used as an active layer of a liquid crystal driving MOS transistor of LCD (Liquid Crystal Display).

The use of the polycrystalline silicon thin film as the active layer of the MOS transistor causes problems with respect to the low voltage resistance of source-gate and gate-drain junctions, and a large leak current. However, it is known that junction characteristics can be improved by employing a high-resistance drain (LDD: Lightly Doped Drain) structure, significantly decreasing the thickness of the polycrystalline film for controlling the resistance, and improving crystallinity by using a solid phase growth method, without a decrease in the driving ability of the MOS transistor (refer to Bulletin of the Electric Information Communication Society, C-11, Vol. J73-11, No. 4, pp. 277–283).

On the other hand, TFT (Thin Film Transistor) comprising the polycrystalline silicon thin film heat-treated at a high temperature requires that a gate oxide film is formed by heat treatment at a high temperature of about 1000° C., and that LDD and source and drain regions are activated, and thus a quartz glass substrate which is expensive and cannot easily be increased in size must be used. This causes difficulties in decreasing the cost of the LCD and increasing the size.

In order to solve the above problems of the polycrystalline silicon TFT subjected to heat treatment at a high temperature, research is made for obtaining high-performance TFT characteristics in which an amorphous silicon film is formed on inexpensive light-transmitting borosilicate glass, and a pulse-formed eximer laser beam is applied to the film, followed by heat treatment at a low temperature to improve crystallization and crystallinity of the polycrystalline silicon thin film.

However, the eximer laser annealing means has many unstable factors which affect the TFT characteristics, such as the fluctuation of laser energy per pulse, the nonuniform distribution and changes in the laser beam profile with time, the selection of the TFT structure, i.e., a stagger type or reverse stagger type, formation conditions for the amorphous silicon film, the forming apparatus, etc. The annealing means thus interferes with improvement in the TFT characteristics and productivity.

Since the above problems are finally collected into the voltage resistance of the drain junction and leak current, it is important to suppress the leak current generated in the interface between the polycrystalline silicon and an insulating layer in a low electric field, and the tunnel current in a high electric field, increase the crystal grain size of polycrystalline silicon in order to obtain a large drain current (driving current), and lower the barrier by decreasing the defect density in the crystal grain boundary. However, this cannot easily be achieved.

SUMMARY OF THE INVENTION

The present invention has been achieved for solving the above problems, and provides a semiconductor device, a manufacturing method therefor, and a liquid crystal driving apparatus comprising the semiconductor device.

In accordance with one aspect of the present invention, there is disclosed a semiconductor device comprising an active layer comprising an amorphous silicon film or a polycrystalline silicon film, a first insulating layer in contact with a side of the active layer in the direction of the thickness thereof, a second insulating layer in contact with the other side of the active layer in the direction of the thickness thereof, a first electrode for applying a predetermined voltage to the active layer through the first insulating layer, and a second electrode for applying a predetermined voltage to the active layer through the second insulating layer.

In accordance with another aspect of the present invention, there is disclosed a method of manufacturing a semiconductor device comprises the steps of forming a first electrode at a predetermined position on an insulating substrate having light transmission; continuously forming a first insulating layer covering the upper sides of the insulating substrate and the first electrode, an amorphous silicon film on the first insulating layer and a second insulating layer on the silicon film; etching the second insulating layer to leave a portion in a shape corresponding to the first electrode; injecting a predetermined impurity into a portion of the amorphous silicon film other than a portion corresponding to the second insulating layer left by etching to form LDD, a source region and a drain region; dehydrogenating, crystallizing and activating at least the amorphous silicon film by applying a laser beam thereto; and forming a second electrode on the polycrystalline silicon film formed by crystallizing the amorphous silicon film through the second insulating layer left by etching.

In accordance with a further aspect of the present invention, there is disclosed a method of manufacturing a semiconductor device comprises forming a first metal anti-contamination film and a first layer stress buffer film in this order to form a first insulating layer, and a second layer stress buffer film and a second metal anti-contamination film in this order to form a second insulating layer.

In accordance with a still further aspect of the present invention, there is disclosed a method of manufacturing a semiconductor device comprises the steps of forming a first insulating layer in a single crystal silicon substrate by implanting first oxygen ions to a predetermined depth of the single crystal silicon substrate and thermal oxidation; implanting first impurity ions to a portion corresponding to each of a first gate electrode region larger than an active region, and source and drain regions adjacent to the active region on the first insulating layer in the single crystal silicon substrate; implanting second oxygen ions into portions other than the portions above the source and drain regions implanted with the first impurity ions and a portion above the first gate electrode region not corresponding to the active layer region; implanting second impurity ions into a portion above at least the first gate electrode region; diffusing the first impurity ions by predetermined heat treatment to form the first gate electrode, the source region and the drain region, and diffusing the second oxygen ions by heat treatment to form an insulating layer continued from the first insulating layer around the gate electrode, as well as diffusing the second impurity ions by heat treatment to form a takeoff region extending upward from the first gate electrode; forming source and drain electrodes which contact the source region and the drain region, respectively, and forming a second gate electrode on the active layer region through the second insulating layer, and a first gate electrode takeoff pattern in contact with the takeoff region.

In accordance with a further aspect of the present invention, there is disclosed a liquid crystal driving apparatus comprising a semiconductor device for driving a liquid crystal and a pixel opening which are provided on an light-transmitting insulating substrate; an opaque conductive film provided on a portion of the insulating substrate except the pixel opening; a first insulating layer provided on a portion of the opaque conductive film corresponding to the semiconductor device; an active layer provided on the first insulating layer; a second insulating layer provided on the active layer; and an electrode provided on the second insulating layer.

In the semiconductor device of the present invention comprising the active layer composed of amorphous silicon or polycrystalline silicon, the two electrodes (so-called a "double gate structure") including the first and second electrodes are formed through the first insulating layer and the second insulating layer, respectively, so that an electric field can be applied to the active layer from each of the electrodes, and it is thus possible to effectively prevent the occurrence of a leak current and a tunnel leak current between the active layer and each of the insulating layers.

Since a first carrier channel layer and a second carrier channel layer are formed in the active layer on the first and second electrode sides, respectively, a driving current flows through each of the carrier channel layers, thereby substantially at least doubling the driving current as a whole. Such a driving current permits the achievement of a high ON/OFF ratio and improves the characteristics of the semiconductor device.

In the method of manufacturing a semiconductor device of the present invention, since the first insulating layer, the amorphous silicon film and second insulating layer are continuously formed, attempts can be made to prevent contamination in the course of manufacture, and relieve the layer stress. In addition, since the first insulating layer comprises the first metal anti-contamination film and the first layer stress buffer film, and the second insulating layer comprises the second layer stress buffer film and the second metal anti-contamination film, it is possible to relieve the layer stress and prevent pollution of the active layer with alkaline metal ions and metal impurities.

In the semiconductor device comprising a single crystal silicon substrate according to the present invention, combination of implantation of an impurity ion to the predetermined position and predetermined depth and heat treatment permits the embedding of the first gate electrode in the single crystal silicon substrate and the formation of the first insulating layer, the active layer and the second insulating layer. The formation of the second gate electrode on the second insulating layer permits the formation of the so-called double gate structure.

In the liquid crystal driving apparatus of the present invention, the opaque conductive film provided on the portion of the light-transmitting insulating substrate except the pixel opening serves as a gate electrode and a shield film, thereby forming a structure which is capable of preventing a leak current due to the light reflected from the back side of the light-transmitting insulating substrate.

DESCRIPTION OF THE EMBODIMENTS

A semiconductor device, a manufacturing method therefor, and a liquid crystal driving apparatus comprising the semiconductor device in accordance with embodiments of the present invention are described with reference to the drawings. FIG. 1 is a schematic sectional view illustrating a semiconductor device in accordance with a first embodiment of the present invention.

Figure 1A:
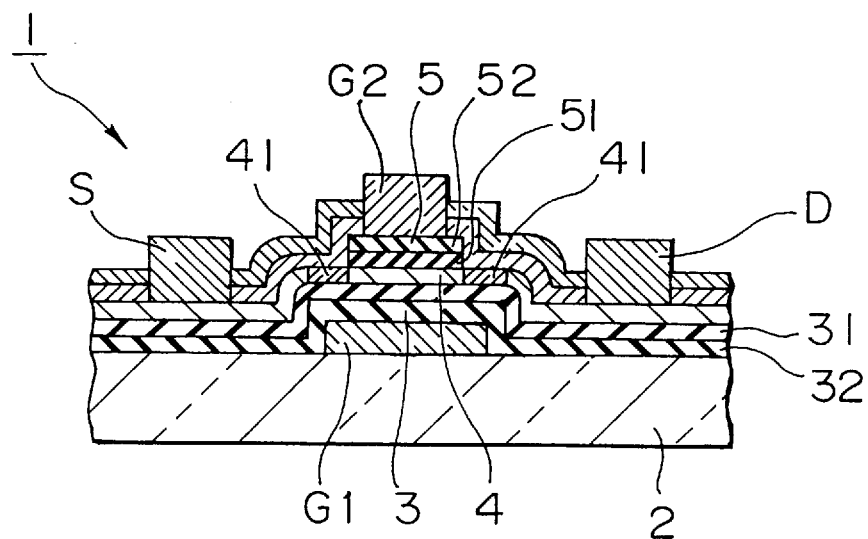
FIGS. 1A and 1B are schematic sectional views illustrating a first embodiment.

The semiconductor device 1 shown in FIG. 1A has an in-gate LDD structure, and comprises a first gate electrode G1 provided on a light-transmitting substrate 2 comprising borosilicate glass, a first insulating layer 3, an active layer 4 comprising an amorphous silicon film or a polycrystalline silicon film, a second insulating layer 5, a second gate electrode G2, and a LDD region 41 provided in a portion of the active layer 4 corresponding to the first gate electrode G1. Namely, in the semiconductor device 1, the active layer is held between the first gate electrode provided through the first insulating layer 3, and the second gate electrode G2 provided through the second insulating layer 5 so that the current flowing between source electrode S and drain electrode D can be controlled.

Figure 1B:
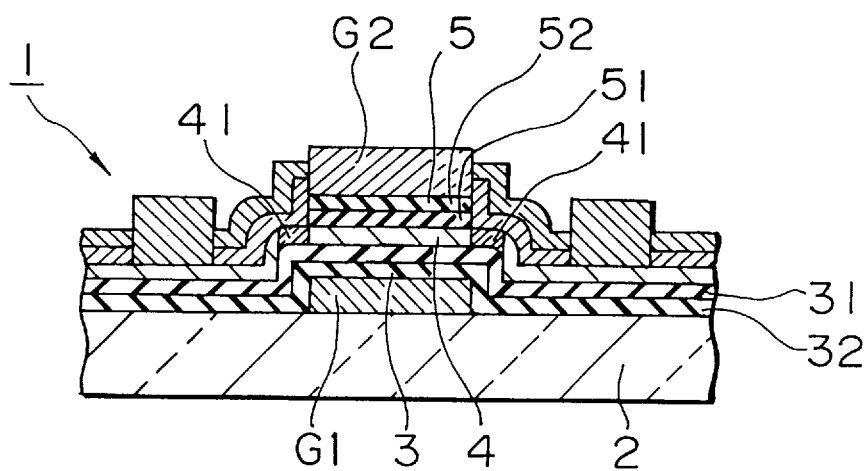

The semiconductor device 1 shown in FIG. 1B has an out-of-gate LDD structure and is the same as the semiconductor device 1 shown in FIG. 1(a) in the point that it comprises a first gate electrode G1 provided on a light-transmitting substrate comprising borosilicate glass, a first insulating layer 3, an active layer 4 comprising an amorphous silicon film or a polycrystalline silicon film, a second insulating layer 5, and a second gate electrode G2. However, the semiconductor device 1 shown in FIG. 1B is different from the semiconductor device shown in FIG. 1A in the point that a LDD region 41 is provided outside a portion of the active layer 4 corresponding to the first gate electrode G1 and the second gate electrode G2.

In either of the semiconductor devices, the first insulating layer 3 comprises a fist silicon oxide film 31 and a first silicon nitride film 32 which are provided in this order from the side of the active layer 4 to the side of the first gate electrode G1, and the second insulating layer 5 comprises a second silicon oxide film 51 and a second silicon nitride film 52 which are provided in this order from the side of the active layer 4 to the side of the second gate electrode G2.

The above structure in which the active layer 4 is held between the first gate electrode G1 provided through the first insulating layer 3, and the second gate electrode G2 provided through the second insulating layer 5 forms a first carrier channel layer in the active layer 4 on the side of the first gate electrode G1, and a second carrier channel layer in the active layer 4 on the side of the second gate electrode G2. This can decrease the leak current and tunnel leak current generated in the interfaces between the active layer 4 and the first and second insulating layers 3 and 5, thereby at least doubling the driving current due to the two carrier channel layers.

In addition, since the first insulating layer 3 comprises the first silicon oxide film 31 and the first silicon nitride film 32, and the second insulating layer 5 comprises the second silicon oxide film 51 and the second silicon nitride film 52, the layer stress and dust contamination between the layers can be decreased, and the first silicon nitride film 32 and the second silicon nitride film 52 can prevent the active layer 4 from being contaminated with alkaline metal ions and metal impurities from the side of the substrate 2 or the outside of the device.

Possible materials for the first and second insulating layers 3 and 5 other than the above materials include the following:

(1) The first and second insulating layers 3 and 5 comprise a silicon oxide film (single layer) and a silicon oxide film (single layer), respectively.

(2) The first insulating layer 3 comprises a silicon nitride film and a silicon oxide film provided in this order from the side of the first gate electrode G1, and the second insulating layer 5 comprises a silicon oxide film (single layer).

(3) The first insulating layer comprises 3 a silicon nitride film and a silicon oxide film provided in this order from the side of the first gate electrode G1, and the second insulating layer 5 comprises a silicon oxide film and a silicon nitroxide film provided in this order from the side of the active layer 4.

(4) The first insulating layer comprises 3 a silicon nitride film and a silicon oxide film provided in this order from the side of the first gate electrode G1, and the second insulating layer 5 comprises a silicon oxide film, a silicon nitroxide film and a silicon nitride film provided in this order from the side of the active layer 4.

(5) The first insulating layer comprises 3 a silicon nitride film, a silicon nitroxide film, and a silicon oxide film provided in this order from the side of the first gate electrode G1, and the second insulating layer 5 comprises a silicon oxide film (single layer).

(6) The first insulating layer comprises 3 a silicon nitride film, a silicon nitroxide film, and a silicon oxide film provided in this order from the side of the first gate electrode G1, and the second insulating layer 5 comprises a silicon oxide film and a silicon nitroxide film provided in this order from the side of the active layer 4.

(7) The first insulating layer comprises 3 a silicon nitride film, a silicon nitroxide film, and a silicon oxide film provided in this order from the side of the first gate electrode G1, and the second insulating layer 5 comprises a silicon oxide film, a silicon nitroxide film, and a silicon nitride film provided in this order from the side of the active layer 4.

(8) The first insulating layer comprises 3 a silicon nitride film, a silicon nitroxide film, and a silicon oxide film provided in this order from the side of the first gate electrode G1, and the second insulating layer 5 comprises a silicon oxide film and a silicon nitride film provided in this order from the side of the active layer 4.

(9) The first insulating layer comprises 3 a silicon nitride film, a tantalum oxide film ($Ta_2O_5$), and a silicon oxide film provided in this order from the side of the first gate electrode G1, and the second insulating layer 5 comprises a silicon oxide film and a tantalum oxide film ($Ta_2O_5$) provided in this order from the side of the active layer 4.

(10) The first insulating layer comprises 3 a silicon nitride film, a tantalum oxide film ($Ta_2O_5$), and a silicon oxide film provided in this order from the side of the first gate electrode G1, and the second insulating layer 5 comprises a silicon oxide film, a tantalum oxide film ($Ta_2O_5$) and a silicon nitride film provided in this order from the side of the active layer 4.

Other materials having the effect of relieving layer stress and preventing metal contamination can be applied.

Figure 2A:
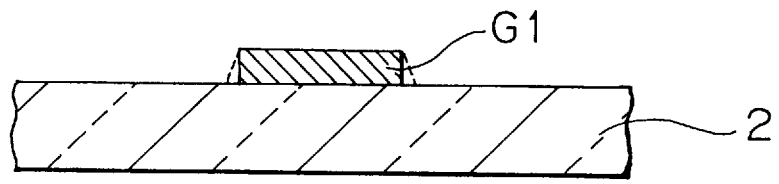
FIGS. 2A–2C are schematic sectional views (I) illustrating the manufacturing method.

The method of manufacturing the semiconductor device 1 of the present invention is described on the basis of schematic sectional views of FIGS. 2 and 3. As shown in FIG. 2A, a molybdenum/tantalum alloy (Mo/Ta) is first deposited to a thickness of about 300 nm on the light-transmitting substrate 2 comprising borosilicate glass by sputtering, followed by photolithography to form the first gate electrode G1. The purpose of using the Mo/Ta alloy is to decrease resistance and improve heat resistance. In order to concentrate and relieve thin film stress and improve voltage resistance, a taper (10° to 30° with the vertical direction) is preferably provided on the side of the first gate electrode G1 to have a trapezoidal sectional form, as shown by broken lines in the drawing.

Figure 2B:
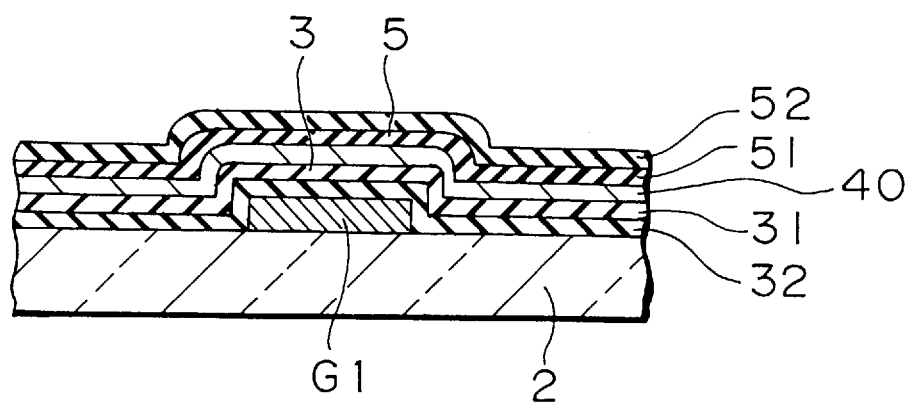

As shown in FIG. 2B, the first insulating layer 3 comprising the first silicon nitride film 32 and the first silicon nitride film 31, the amorphous silicon film 40, and the second insulating layer 5 comprising the second silicon oxide film 51 and the second silicon nitride film 52 are continuously formed over the entire surface of the substrate so as to cover the first gate electrode G1 provided on the substrate 2.

For example, the first silicon nitride film 32 and the second silicon nitride film 52 are grown to a thickness of about 50 nm by using $SiH_4$, $NH_3$ and $N_2$ as reaction gases, the first silicon oxide film 31 and the second silicon oxide film 51 are grown to a thickness of about 50 nm by using $SiH_4$ and $O_2$ as reaction gases, and the amorphous silicon film 40 is grown to a thickness of about 50 nm by using $SiH_4$ as a reaction gas.

These films are continuously grown by changing the reaction gases in the chamber of the same plasma CVD apparatus. Continuous growth is capable of continuously forming the films without opening the chamber to the atmosphere, and thus capable of preventing contaminants from entering between the films, and decreasing as much as possible stress between the layers during film formation.

At least one of the first silicon oxide film 31 and the second silicon oxide film 51 may comprise a silicon nitroxide film ($SiO_xN_y$) and a silicon oxide film ($SiO_2$). Namely, when the first silicon oxide film 31 is formed by using a silicon nitroxide film ($SiO_xN_y$) and a silicon oxide film ($SiO_2$), a silicon nitride film ($SiN_x$) serving as the first metal antipollution film, a silicon nitroxide film ($SiO_xN_y$) serving as the first layer stress buffer film and a silicon oxide film ($SiO_2$) are formed on the first gate electrode G1 in this order.

When the second silicon oxide film 51 is formed by using a silicon nitroxide film ($SiO_xN_y$) and a silicon oxide film (SiO$_2$), a silicon oxide film (SiO$_2$) serving as the second layer stress buffer film, a silicon nitroxide film (SiO$_x$N$_y$) and a silicon nitride film (SiN$_x$) serving as the second metal antipollution film are formed on the amorphous silicon layer 40 in this order.

Even when such a structure is formed, the films can easily be continuously grown by continuously changing the reaction gases introduced into the chamber of the plasma CVD apparatus. This can further relieve the layer stress.

When the first and the second insulating layers 3 and 5 are formed by using a tantalum oxide film and a silicon oxide film serving as a layer stress buffer film, the films can further fined and thinned for improving the characteristics of a MOS transistor, and the thickness of the gate insulating film where a leak current due to direct tunneling is a dominant factor can be reached to 4 nm. In order to decrease the reduced thickness of the silicon oxide film while maintaining a gate insulating film thickness of 4 nm or more, it is also thought to use a Ta$_2$O$_5$ film having a high dielectric constant.

When the first and second insulating films 3 and 5 are formed in a structure comprising a tatalum oxide film, a silicon nitride film (SiN$_x$) serving as the first metal antipollution film is first formed to a thickness of about 100 nm so as to cover the first gate electrode G1 comprising a molybdenum/tantalum (Mo/Ta) alloy, and a tantalum oxide film (Ta$_2$O$_5$) having a thickness of about 100 nm and a silicon oxide film (SiO$_2$) having a thickness of about 50 nm and serving as the first layer stress buffer film are then formed in this order on the silicon nitride film.

The amorphous silicon layer 40 having a thickness of about 50 nm is then formed on the silicon oxide film serving as the first layer stress buffer film, followed by crystallization by applying a laser beam to the amorphous silicon film 40 to form the active layer 4 comprising a polycrystalline silicon film. Crystallization is performed by using an eximer laser beam of XeCl having a wavelength of 308 nm as the laser beam with a quantity of radiation of about 250 to 300 mJ/cm$^2$.

The method of irradiating with the laser beam comprises irradiating with lower energy than the melting energy to remove hydrogen from the amorphous silicon film 40, and irradiating with higher energy than the melting energy to melt and solidify the film. When hydrogen is removed, since no second insulating layer 5 is provided on a portion other than the gate region, hydrogen can sufficiently be removed. This irradiation method simultaneously permits dehydrogenation, crystallization to form the polycrystal silicon film, and activation of phosphorus (P) ions contained in the source, drain and LDD regions, thereby contributing to improvement in productivity.

A silicon oxide film (SiO$_2$) serving as the second layer stress buffer film and having a thickness of about 50 nm is then formed on the active layer 4 formed by crystallizing the amorphous silicon film, and a silicon nitride film (SiN$_x$) serving as the second metal anti-contamination film and having a thickness of about 100 nm is the formed on the silicon oxide film. Each of the films is formed by plasma CVD. During the film formation, the silicon nitride film (SiN$_x$) is formed by using SiN$_4$, NH$_3$ and N$_2$ as reaction gases, the Ta$_2$O$_5$ film is formed by using Ta(OC$_2$H$_5$)$_5$ and O$_2$ as reaction gases, the SiO$_2$ film is formed by using SiN$_4$ and O$_2$ as reaction gases, and the amorphous silicon film 5' is formed by using SiN$_4$ as a reaction gas.

In another structure, a silicon nitride film (SiN$_x$) serving as the first metal anti-contamination film is first formed to a thickness of about 200 nm on the insulating substrate 2, and the first gate electrode G1 comprising molybdenum/ tantalum (Mo/Ta) alloy is then formed to a thickness of 300 nm by sputtering and then dry-etched. Anodic oxidation (0.5 to 1.0% citric acid, 100 V, 1 hour) of the Mo/Al alloy is then performed to form a tantalum oxide film (Ta$_2$O$_5$) having a thickness of about 100 nm.

A silicon oxide film (SiO$_2$) serving as the first layer stress buffer film is then formed to a thickness of about 50 nm so as to cover the tatalum oxide film, and the amorphous silicon layer 40 is formed to a thickness of about 50 nm on the silicon oxide film, followed by crystallization by applying a laser beam to the amorphous silicon film 40 by the same irradiation method as described above to form the active layer 4 comprising a polycrystalline silicon film.

A silicon oxide film (SiO$_2$) serving as the second layer stress buffer film is then formed to a thickness of about 50 nm on the active layer 4. Each of the films is formed by plasma CVD using the same reaction gases as described above.

Figure 2C:
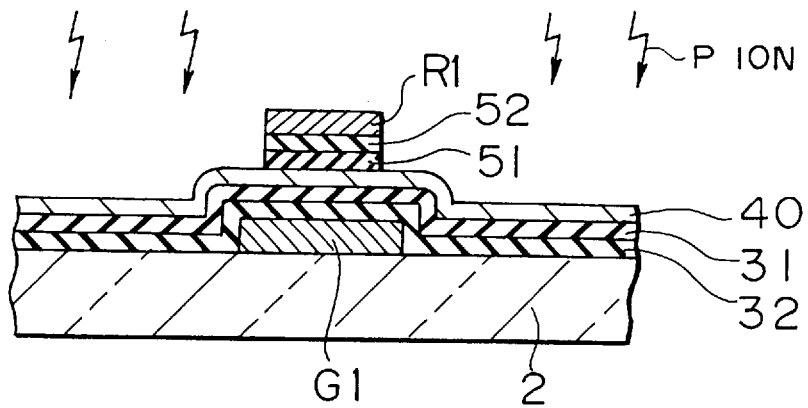

As shown in FIG. 2C, ion doping stopper resist R1 is then formed, followed by doping with phosphorus (P) ions in a low dose for forming the LDD region 41 (refer to FIG. 1A). Before ion doping, photolithography is performed for leaving a portion of the resist R1 having a slightly smaller width than that of the first gate electrode G1, and the second silicon nitride film 52 and the second silicon oxide film 51 are etched to leave portions thereof having the same width of the remaining resist. The second silicon nitride film 52 and the second silicon oxide film 51 are dry-etched with CF$_4$ and wet-etched with HF, respectively.

In photolithography of the resist R1, the back side of the substrate having the resist R1 coated to a thickness of 300 nm over the entire surface thereof is over-exposed by using the first gate electrode G1 as a mask. The exposed portion of the resist R1 is removed to leave a portion of the resist R1 having a slightly smaller width than that of the first gate electrode G1. Doping with phosphorus (P) ions is performed in a low dose, for example, about $10^{12}$ to $10^{13}$ cm$^{-2}$, by using as a mask the resist R1, the second silicon nitride film 52 and the second silicon oxide film 51 all of which have the above width.

Figure 3A:
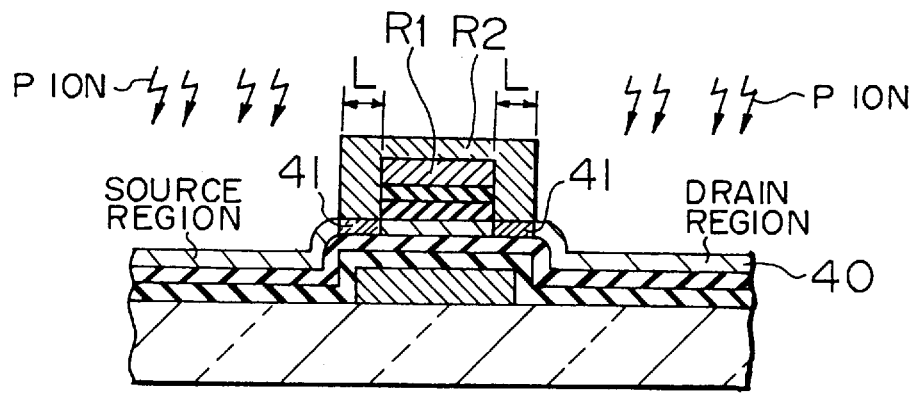
FIGS. 3A–3C are schematic sectional views (II) illustrating the manufacturing method.

As shown in FIG. 3A, resist R2 is then formed so as to cover the resist R1, the second silicon nitride film 52 and the second silicon oxide film 51, followed by doping with phosphorus (P) ions in a high dose by using the resist R2 as a mask to form the source region and the drain region.

The resist R2 is coated to a thickness of about 300 nm over the entire surface of the substrate 2 and just-exposed to light from the back side of the substrate 2 by using the first gate electrode G1 as a mask. Doping with phosphorus (P) ions is performed in a dose of $10^{14}$ to $10^{15}$ cm$^{-2}$ by using the resist R2 as a mask, to form the source and drain regions comprising the amorphous silicon film 40 doped with a high concentration of phosphorus ions.

In doping, since a portion having a width L corresponding to the difference between the widths of the resist R1 and resist R2 remains as a region doped with a low concentration of phosphorus (P) ions, the size of the LDD region 41 is determined by the width L.

After doping with phosphorus (P) ions in a high dose, the resists R1 and R2 are removed. The resists are sufficiently cleaned off by using a solution comprising, for example, H$_2$SO$_4$ and H$_2$O$_2$ at a ratio of 5:1, so as not to leave the resists.

Figure 3B:
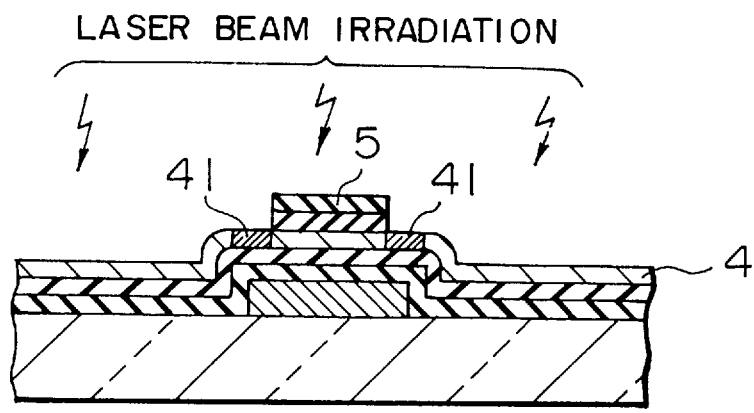

As shown in FIG. 3B, a laser beam is applied to the amorphous silicon film 40 through the exposed second isolating layer 5 to crystallize the amorphous silicon film 40 to form the active layer 4 comprising a polycrystalline silicon film. Crystallization is performed by using an eximer laser beam of XeCl, for example, having a wavelength of 308 nm as the laser beam with a quantity of radiation of about 250 to 300 mJ/cm$^2$.

The method of irradiating with the laser beam comprises irradiating with lower energy than the melting energy to remove hydrogen from the amorphous silicon film 40, and irradiating with higher energy than the melting energy to melt and solidify the film in the same manner as described above. When hydrogen is removed, since no second insulating layer 5 is provided on a portion other than the gate region, hydrogen can sufficiently be removed. This irradiation method simultaneously permits dehydrogenation, crystallization to form the polycrystal silicon film, and activation of phosphorus (P) ions contained in the source, drain and LDD regions, thereby contributing to improvement in productivity.

Figure 3C:
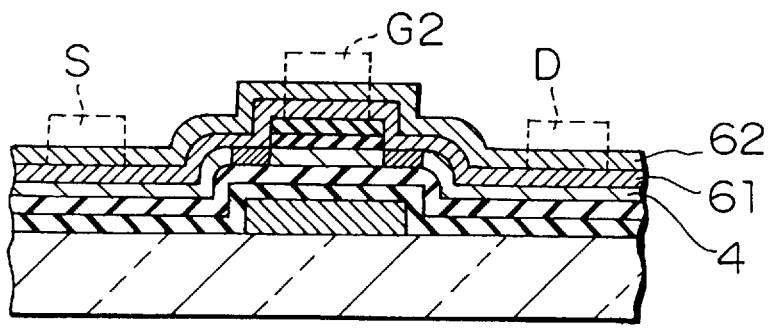

As shown in FIG. 3C, PSG (Phospho-Silicate Glass, representing a silicon oxide film containing phosphorus) 61 is deposited on the active layer 4 formed by crystallization, and a silicon nitride film 62 is deposited on the PSG 61 by an atmospheric CVD method or a plasma CVD method. For example, the PSG 61 is grown to a thickness of about 300 nm by using $SiH_4$, $PH_3$ and $O_2$ as reaction gases. The phosphorus content of the PSG 61 is a few % by weight. The silicon nitride film 62 is grown to a thickness of about 200 nm by using $SiH_4$, $NH_3$ and $N_2$ as reaction gases.

With the PSG 61 and the silicon nitride film 62 deposited on the substrate 2, hydrogenation annealing is then performed. Hydrogenation annealing is carried out by heat treatment in a forming gas, for example, at 400° C. for 3 to 4 hours. The active layer 4 comprising a polycrystalline silicon layer has many silicon dangling bonds in the grain boundaries, which function as production and recombination centers of carriers and generate leak current. This hydrogenation annealing cuts the silicon dangling bonds and improves the field effect mobility of electrons and holes, thereby suppressing the occurrence of the leak current.

In the hydrogenation annealing of the substrate 2 with the PSG 61 and the silicon nitride film 62 deposited, the generated hydrogen is captured in the active layer 4 by employing the hygroscopicity of the PSG 61, and the silicon dangling bonds are cut by heat treatment. The reason for depositing the silicon nitride film 62 on the PSG 61 is to increase the hydrogenation annealing effect by sealing hydrogen in the silicon nitride film 62. Namely, the silicon nitride film 62 does not transmit hydrogen, and can thus be used as a cap film.

Although the hydrogenation annealing is carried out with the PSG 61 and the silicon nitride film 62 deposited, hydrogenation annealing may comprise hydrogen plasma processing after irradiation of the laser beam, as shown in FIG. 3B, and heat treatment in a state wherein a silicon nitride is deposited in place of the deposition of the PSG 61 and the silicon nitride film 62. In this case, a point is to use the silicon nitride film as a cap film.

After hydrogenation annealing is completed, the second gate electrode G2, the source electrode S and the drain electrode D are formed as shown by broken lines in FIG. 3C. The second gate electrode G2, the source electrode S and the drain electrode D are formed by a method in which an opening is formed at a position in the silicon nitride film 62 and the PSG 61 corresponding to each of the electrodes by dry etching with $CF_4$ and wet etching with $HF:NH_4$, respectively, and, for example, 1% Si-containing aluminum (Al) is deposited to a thickness of about 600 nm by sputtering, etched with a phosphoric acid etching solution to form each of the electrodes; and then sintered at 400° C. for about 1 hour.

The semiconductor device 1 shown in FIG. 1A is completed by the above-described processing. When the semiconductor device 1 shown in FIG. 1B in which the LDD region 41 is provided outside the first gate electrode G1 is manufactured, the semiconductor device can easily be manufactured by a method in which the back side of the substrate 2 is just-exposed to light to leave a portion of the resist R1 shown in FIG. 2C which has the same width as that of the first gate electrode G1.

Another example of the semiconductor device 1 in accordance with the first embodiment will be described below. The semiconductor device 1 of this example is characterized in that the second gate electrode G2 of the semiconductor device 1 shown in FIG. 1 is divided into two parts. FIG. 4 is a schematic sectional view illustrating the method of manufacturing the semiconductor device 1 of this example.

Figure 4A:
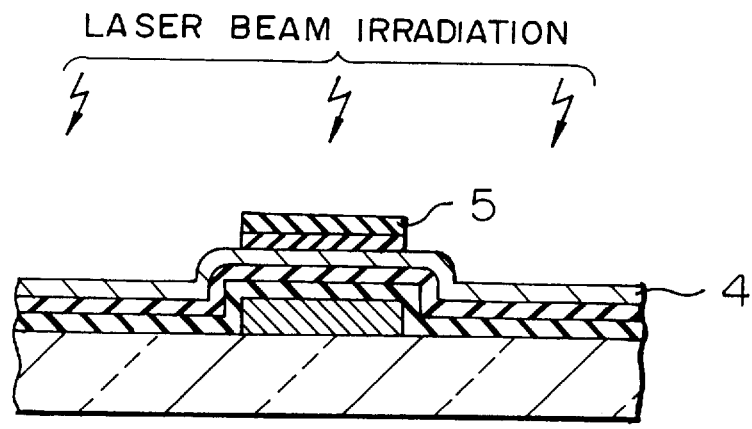
FIGS. 4A–4C are schematic sectional views (III) illustrating the manufacturing method.

As shown in FIG. 4A, a laser beam is applied to the amorphous silicon film 40 through the second insulating layer 5 to crystallize the amorphous silicon film 40 to form the active layer 4 comprising a polycrystalline silicon film. Crystallization is carried out by using as the laser beam an eximer laser beam of, for example, XeCl having a wavelength of 308 nm, with a quantity of radiation of about 250 to 300 mJ/cm$^2$.

Figure 4B:
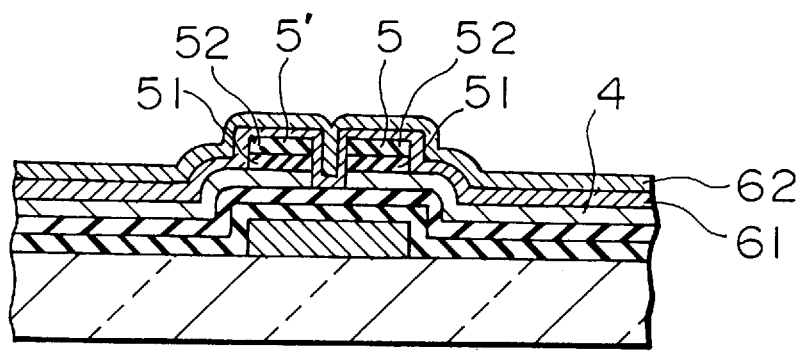

As shown in FIG. 4B, the second insulating layer 5 (refer to FIG. 4A) and the active layer 4 are divided to form new second insulating layer 5 and third insulating layer 5', and the PSG 61 and the silicon nitride film 62 are then deposited. The second silicon nitride film 52 and the second silicon oxide film 51 of the second insulating layer 5 are removed by dry etching with $CF_4$ and dry etching with $CCl_4$, respectively, and the active layer 4 comprising a polycrystalline silicon film is removed by dry etching with $CF_4$. Division is made along a line passing substantially the center between the source electrode S and the drain electrode D, which will be described below.

Figure 4C:
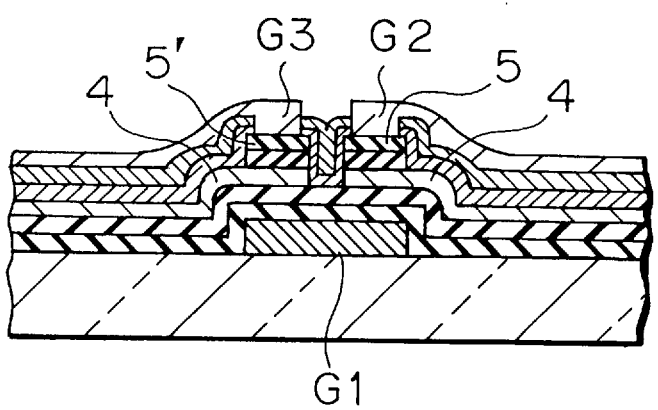

The same hydrogenation annealing as described above is performed with the PSG 61 and the silicon nitride film 62 deposited, and the second gate electrode G2 and the third gate electrode G3 are then formed on the second insulating layer 5 and the third insulating layer 5', respectively, as shown in FIG. 4C. As a result, the first gate electrode G1 is formed below the active layer 4, and the second gate electrode G2 and the third gate electrode G3 are formed above the active layer 4.

Figure 5A:
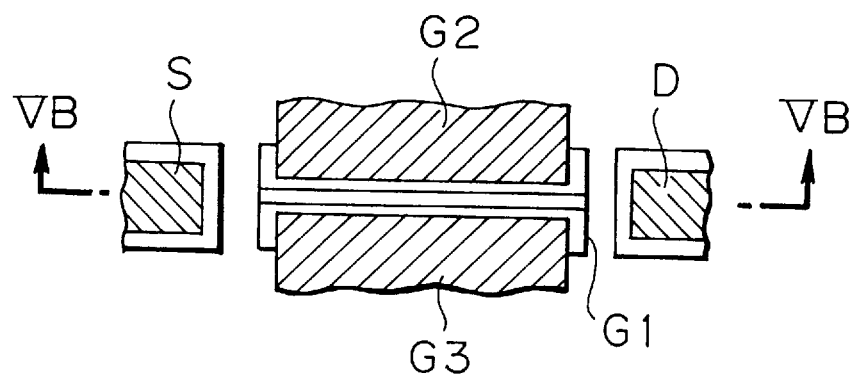
FIGS. 5A and 5B are schematic sectional views illustrating the state of electrodes.
Figure 5B:
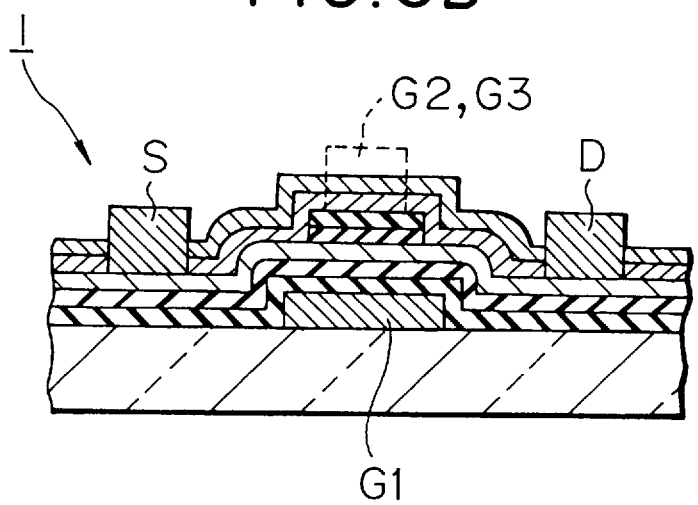

FIG. 5 is a schematic drawing illustrating the state of the electrodes, FIG. 5A being a plan view, and FIG. 5B being a sectional view taken along line VB—VB of FIG. 5A. Namely, the second gate electrode G2 and the third gate electrode G3 are formed with the substantially central line between the source electrode S and the drain electrode D as the boundary. Such a divided structure can improve the TFT characteristics by improve the hydrogenation annealing effect. The semiconductor device 1 thus has a triple gate structure in which a voltage is applied from all the first gate electrode G1, the second gate electrode G2 and the third gate electrode to form three channel carrier layers in the active layer 4 on the sides of the first gate electrode G1, the second gate electrode G2 and the third gate electrode G3, respectively. Therefore, the driving current obtained by the three channel carrier operations is at least triple the driving current in the case where a single gate electrode is provided.

Even if a defect is present in either of the second gate electrode G2 and the third gate electrode G3, the device can be operated by using the other gate electrode. This can significantly increase the characteristic yield of the semiconductor device 1.

Although the first embodiment relates to the method of manufacturing the semiconductor device 1 comprising low-temperature processing using the light-transmitting substrate 2 comprising borosilicate glass, the semiconductor device 1 may be manufactured by high-temperature processing using quartz glass as the substrate 2. In this case, the first gate electrode G1 and the second gate electrode G2 shown in FIG. 1 are formed by using a high content n+ polycrystalline silicon film (thickness: about 300 nm, 50 to 100 Ω/☐).

In the semiconductor device 1, when the light reflected from the back side of the substrate 2 comprising quartz glass enters the first gate electrode G1 and the second gate electrode G2 each comprising a polycrystalline silicon film, part of the reflected light, particularly, blue light having short wavelengths, is absorbed to generate electron-hole pairs in the gate electrodes G1 and G2. However, since a predetermined voltage for driving the semiconductor device 1 is always applied to the first gate electrode G1 and the second gate electrode G2, the reflected light causes no adverse effect.

When the semiconductor device 1 is turned off, even if the reflected light enters the active layer 4 to generate electron-hole pairs therein, since a hole accumulating layer is formed near the interfaces with the first insulating layer 3 and the second insulating layer 5 due to the negative potential applied to the first gate electrode G1 and the second gate electrode G2, the generated electrons are recombined, and the holes are accumulated, thereby flowing no leak current between the drain and the source.

Since the first insulating layer 3 and the second insulating layer 5 do not necessarily have the same thickness and the same quality, the voltage applied to the first gate electrode G1 is different from the voltage applied to the second gate electrode G2. If when the TFT characteristics of the carrier channel layer formed in the active layer 4 on the side of the first gate electrode G1 are made the same as the TFT characteristics of the carrier channel layer formed in the active layer 4 on the side of the second gate electrode G2, the voltages respectively applied to the first gate electrode G1 and the second gate electrode G2 must be adjusted according to the correlations between the thicknesses and qualities of the first and second insulating layers 3 and 5.

When the semiconductor device 1 of the present invention is used for a liquid crystal display, in order to prevent contamination of alkaline ions from the glass substrate, the thickness of the first silicon nitride film 32 of the first insulating layer 3 is thicker than the second silicon nitride film 52 of the second insulating layer 2, and the first gate electrode G1 is fixed to zero or negative potential. In this case, the first gate potential for controlling the carrier channel layer formed in the active layer 4 on the side of the first gate electrode G1 is sometimes substantially lower than the second gate potential.

When a negative voltage for turning the current off is always applied only to the first gate electrode G1 so as not to interfere with the positive voltage applied to the second gate electrode G2 for securing a sufficient drain current, the hole accumulating layer is always formed near the interface between the first gate electrode G1 and the first insulating layer 3, thereby causing a state wherein no leak current flows in the interface between the first gate electrode G1 and the first insulating layer 3. Particularly, in this state, with a voltage lower than that in a normal case with a single gate electrode (the voltage applied to the second gate electrode 2), a drain current with high response and a low leak current, i.e., switching characteristics with high response and TFT characteristics with low power consumption, can be obtained.

Although this embodiment relates to the manufacture of the semiconductor device 1 comprising nMOS-type TFT by doping the intrinsic semiconductor amorphous silicon film or polycrystalline silicon film as a base with phosphorus ions, the semiconductor device 1 comprising pMOS-type TFT can be manufactured by doping with boron ions.

The semiconductor device 1 of this embodiment has a so-called double gate structure and thus basically exhibits good TFT current characteristics. When the threshold voltage value of TFT is stabilized by suppressing the leak current in order to increase the ON/OFF ratio of the drain current at some degree of sacrifice of the TFT current characteristics, therefore, the channel formation region of the active layer 4 may be the p$^-$ conduction type (nMOS type TFT) or n$^-$ conduction type (pMOS type TFT).

In this case, the amount of ions injected into the n$^-$ channel formation region is larger than the amount of ions injected into the p$^-$ channel formation region. For example, the amount of the ions injected into the n$^-$ channel formation region may be $10^{12}$ to $10^{13}$ cm$^{-2}$ or $10^{13}$ to $10^{14}$ cm$^{-2}$, and the amount of the ions injected into the p$^-$ channel formation region may be about $10^{12}$ to $10^{13}$ cm$^{-2}$.

Although, in all examples of this embodiment, the first gate electrode G1 is formed directly on the surface of the substrate 2, the first gate electrode G1 may be provided through a silicon nitride film (about 300 nm thick) formed on the surface of the substrate 2 in order to prevent Na$^+$ contamination from the substrate 2. Particularly, when the semiconductor device 1 of this embodiment is applied to an apparatus such as a liquid crystal projector or the like which strong light enters, if the first and second insulating layers 3 and 5 comprise a silicon nitride film, the threshold voltage (Vth) is shifted due to charging up, thereby causing deterioration in image quality due to a V-H scanner error and a leak current. Therefore, in some cases, the first and second insulating layers 3 and 5 comprise only a silicon oxide film. In such a structure, in order to prevent Na$^+$ contamination from the substrate 2, the first gate electrode G1 may be provided through the silicon nitride film formed on the surface of the substrate 2.

Figure 6A:
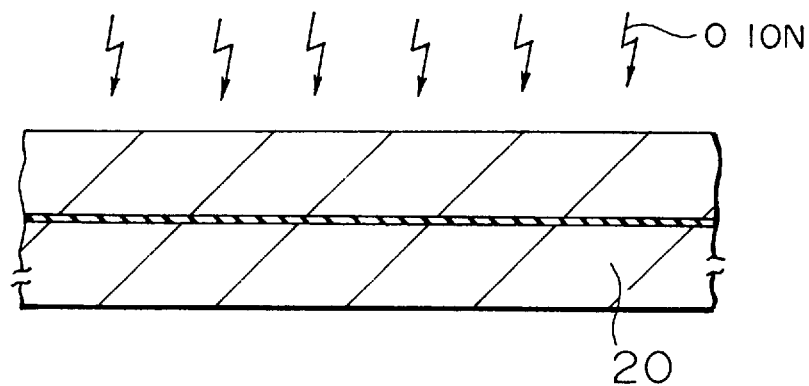
FIGS. 6A–6C are schematic sectional views (I) illustrating the manufacturing method using a silicon substrate.

Description will now be made of the method of manufacturing the nMOS-type semiconductor device 1 comprising a single crystal silicon substrate (simply referred to as a "silicon substrate" hereinafter) on the basis of FIGS. 6 and 7. As shown in FIG. 6A, oxygen ions are implanted to a depth of about 500 nm from the surface of the p-type silicon substrate 20 having a concentration of about $10^{15}$ to $10^{16}$ cm$^{-2}$. Oxygen ions are implanted in a dose of about $10^{20}$ to $10^{21}$ cm$^{-2}$ with an energy of 100 keV.

Figure 6B:
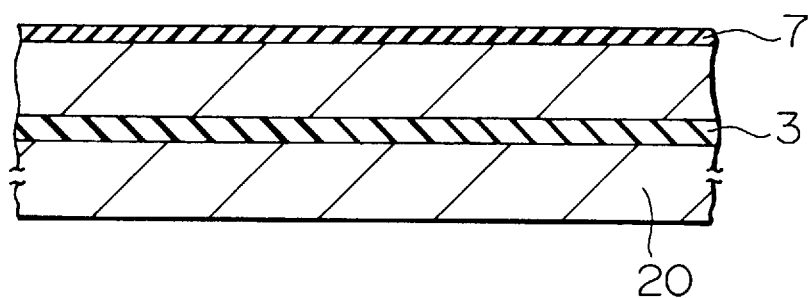

As shown in FIG. 6B, the silicon substrate 20 which is implanted with oxygen ions is oxidized to form the first insulating layer 3 in the silicon substrate 20. The oxidation is effected by heat treatment in an O$^2$ atmosphere at 1000° C. for about 30 minutes. The heat treatment forms a silicon oxide film 7 on the surface of the silicon substrate 20.

Figure 6C:
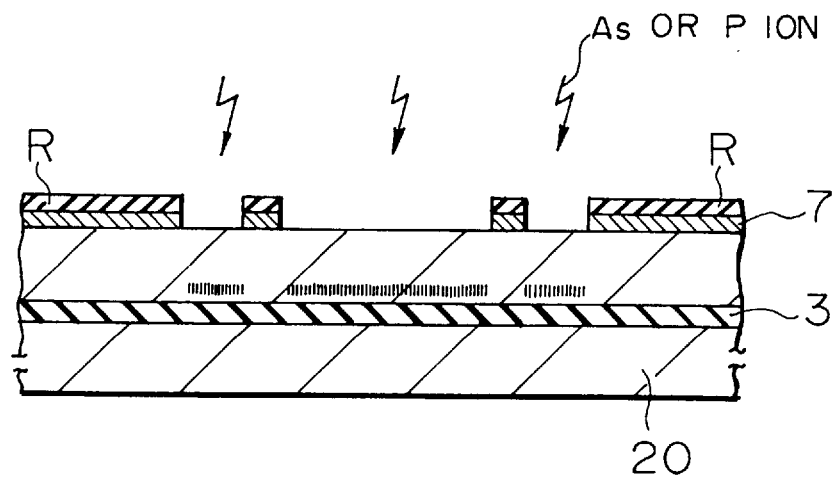

As shown in FIG. 6C, resist R is then deposited on the silicon oxide film 7 on the silicon substrate 20, and openings are formed in portions where the source, drain and first gate electrode, which will be described below, are respectively formed. Phosphorus ions or arsenic ions are implanted in a region above the first insulating layer 3. Phosphorus ions or arsenic ions are implanted in a dose of about $10^{19}$ cm$^{-2}$ (for arsenic ions, $10^{19}$ cm$^{-2}$ or more) with an energy of 100 keV. The regions which are implanted with phosphorus ions or arsenic ions is converted to portions of the n$^+$ embedded layer and the first gate electrode by subsequent heat treatment.

Figure 7A:
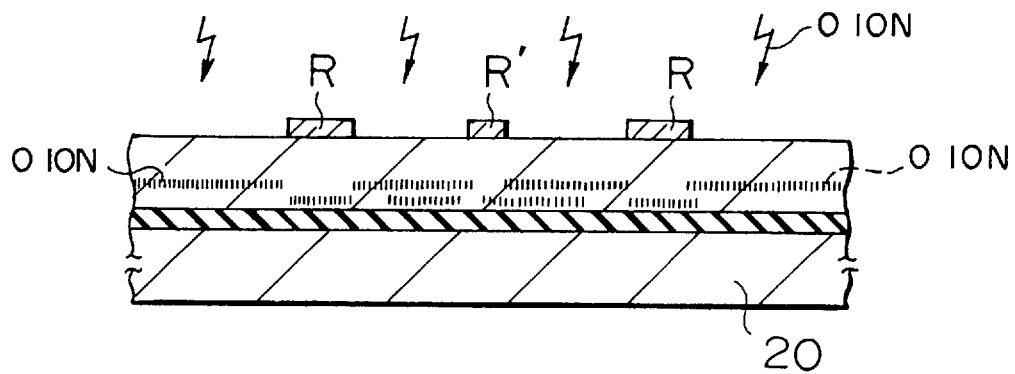
FIGS. 7A–7C are schematic sectional views (II) illustrating the manufacturing method using a silicon substrate.
Figure 7B:
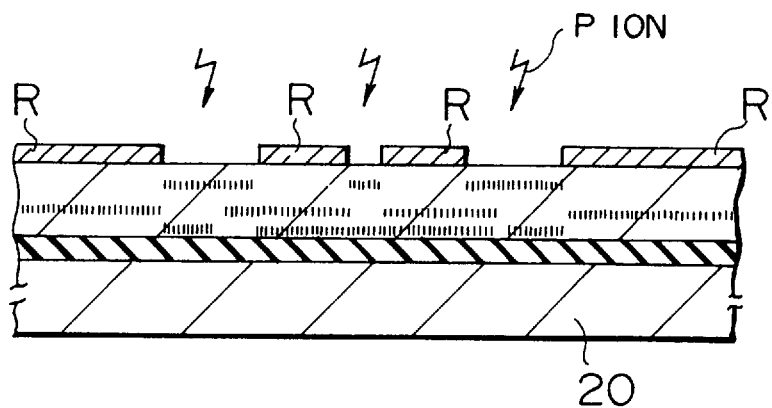

As shown in FIG. 7A, in order to form the first insulating layer and an insulating layer for separating an element, which will be described below, the silicon oxide film 7 is removed by using a fluoric acid etching solution, and resists R and R' are then formed at predetermined positions on the silicon substrate 20, followed by implantation of oxygen ions. Oxygen ions are implanted in a dose of about $10^{20}$ to $10^{21}$ cm$^{-2}$ with an energy of 50 keV. In this case, the resist R' is provided on a portion corresponding to the lead-out portion of the first gate electrode, which is embedded in the silicon substrate 20 and which will be described below, the portion being deviated from the position of the active layer in a plane view.

After the resists R and R' are removed by cleaning with a mixed solution of sulfuric acid ($H_2SO_4$) and an aqueous hydrogen peroxide solution ($H_2O_2$), resist R is formed in regions on the silicon substrate 20 other than the source, drain and LDD regions, which will be described below, followed by implantation of phosphorus ions for forming the LDD region. Phosphorus ions are implanted in a dose of about $10^{17}$ cm$^{-2}$ with an anergy of 30 keV.

Figure 7C:
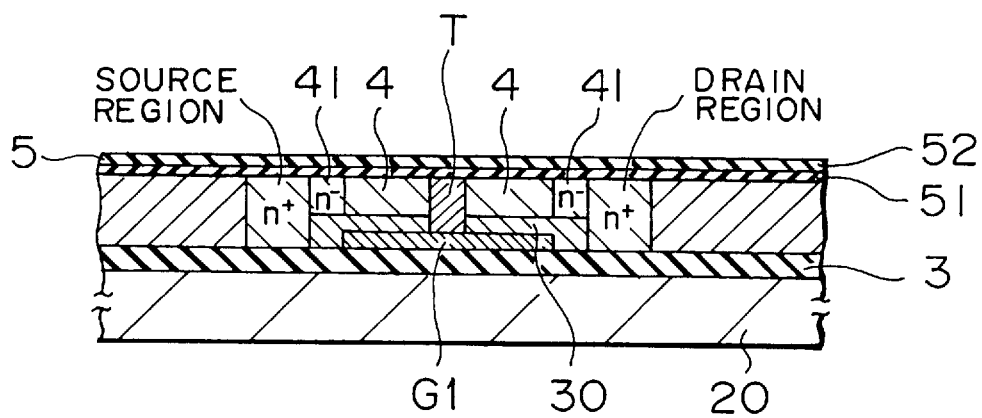

After the above various ions are implanted, the resist R is removed by cleaning, and heat treatment is then performed to diffuse and activate the ions implanted, as shown in FIG. 7C. The heat treatment is performed in an oxygen atmosphere at 1000° C. for about 30 minutes. The diffusion converts the portions implanted with phosphorus (or arsenic) ions by the processing shown in FIG. 6C to the first gate electrode G1, the source region and the drain region shown in FIG. 7C, the portion implanted with oxygen ions by the processing shown in FIG. 7A to the silicon oxide region 30 shown in FIG. 7C and the insulating layer for separating the element, and the portion implanted with phosphorus ions by the processing shown in FIG. 7B to the LDD region 41 and the gate electrode lead-out portion T connected to the first gate electrode G1 shown in FIG. 7C.

The diffusion forms a second silicon oxide film 51 of 50 to 100 nm on the surface, and a second silicon nitride film 52 of about 300 nm is formed by the CVD process, to form the second insulating layer 5.

Figure 8A:
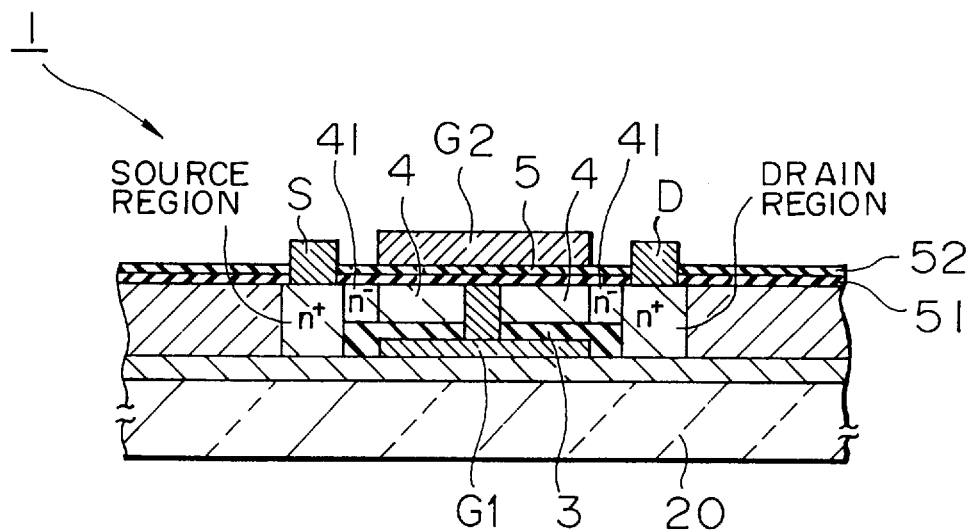
FIGS. 8A and 8B are schematic sectional views illustrating the manufacturing method using a silicon substrate.

As shown in FIG. 8, the second gate electrode G2, the source electrode S and the drain electrode D are then formed. As shown in a sectional view of FIG. 8A, the source electrode S and the drain electrode D are formed by sputtering aluminum containing 1% Si after openings are formed in portions of the second silicon oxide film 51 and the second silicon nitride film 52 corresponding to the n+source region and the drain region, respectively. Aluminum is then etched to leave regions corresponding to the source electrode S, the drain electrode D and the second gate electrode G2, and then sintered.

Namely, portions of the second silicon oxide film 51 and the second silicon nitride film 52 below the second gate electrode G2 serve as the second insulating layer 5, the other portions of the second silicon oxide film 51 and the second silicon nitride film 52 serve as a protective insulating layer.

Figure 8B:
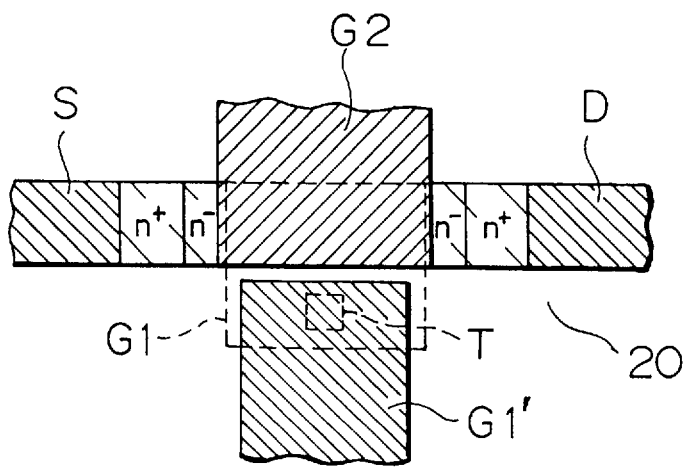

As shown in FIG. 8B, when the first gate electrode G1 embedded in the silicon substrate 20 is led out, a pattern G1' is formed so as not to contact the second gate electrode G2 on the surface through the gate electrode lead-out portion T.

The semiconductor device 1 comprising the silicon substrate 20 shown in FIG. 8A is completed by the above-mentioned manufacturing method. This semiconductor device 1 also has a so-called double gate structure in which the active layer 4 is held between the first gate electrode G1 provided through the first insulating layer 3, and the second gate electrode G2 provided through the second insulating layer, thereby enabling attempts to decrease the leak current and tunnel leak current in the interface between the active layer 4 and the insulating layer, and obtaining a large drain (driving) current.

Figure 9A:
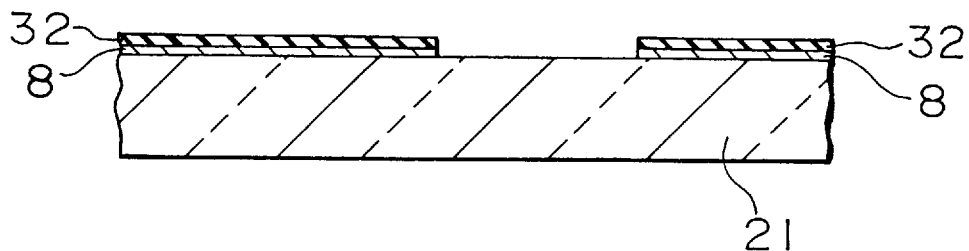
FIGS. 9A–9C are schematic sectional views (I) illustrating the LCD manufacturing method.

Description will now be made of the method of manufacturing a liquid crystal driving device using the semiconductor device 1 in a high-temperature process in accordance with an embodiment of the present invention on the basis of FIGS. 9 to 13. As shown in FIG. 9A, a n$^+$ polycrystalline silicon film 8 and a first silicon nitride film 32 are first formed on a quartz glass substrate 21 (for example, having a diameter of 8 inches and a thickness of 8 mm), and then etched to form an opening at a position corresponding to a pixel which will be described below. The n$^+$ polycrystalline silicon film 8 is formed to a thickness of 30 nm by the CVD method using $SiH_4$ and $PH_3$ as reaction gases. At this time, the sheet resistance of the n$^+$ polycrystalline silicon film 8 is 100 to 500 Ω/□.

The first silicon nitride film 32 is formed to a thickness of 200 nm by the CVD method using $SiH_4$, $NH_3$ and $N_2$ as reaction gases. Both films are formed at a temperature of over 620° C. The n$^+$ polycrystalline silicon film 8 and the first silicon nitride film 32 are etched by dry etching with $CF_4$.

Figure 9B:
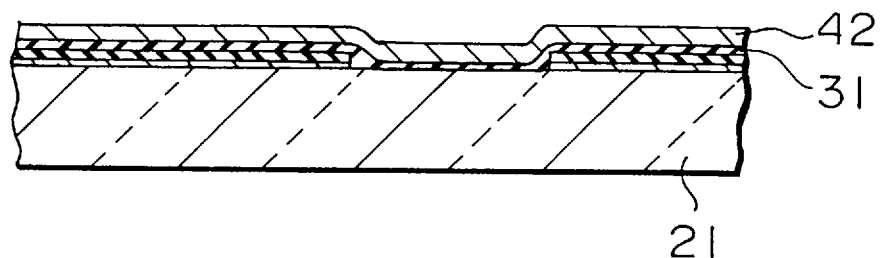

As shown in FIG. 9B, a first silicon oxide film 31 and a polycrystalline silicon film 42 are then formed by the CVD method. At this time, the first silicon oxide film 31 is formed to a thickness of 100 nm by using $SiH_4$ and $O_2$ as reaction gases, and the polycrystalline silicon film 42 is formed to a thickness of 80 nm by using $SiH_4$ as a reaction gas.

Figure 9C:
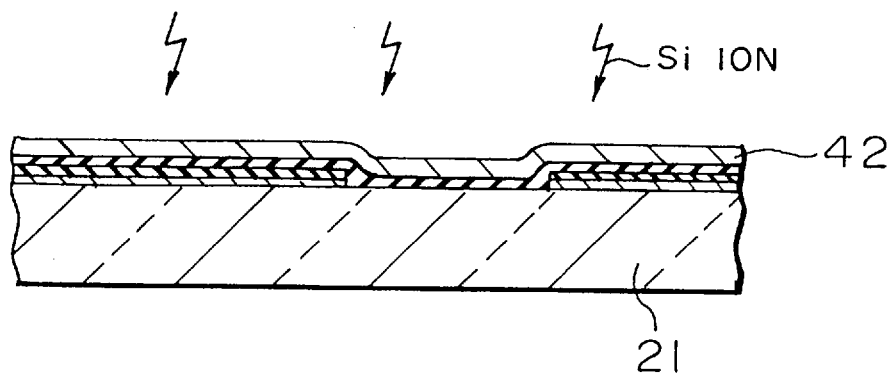

As shown in FIG. 9C, the crystal grain size of the polycrystalline silicon film 42 is increased by Si ion implantation to form an amorphous silicon film. Si ions ($SiH_4$) are implanted at a concentration of $10^{15}$ cm$^{-2}$ with an energy of 30 keV. The amorphous silicon film is then annealed in a $N_2$ atmosphere at 630° to 650° C. for 12 to 15 hours to form the polycrystalline silicon film 42 having a large grain size.

Figure 10A:
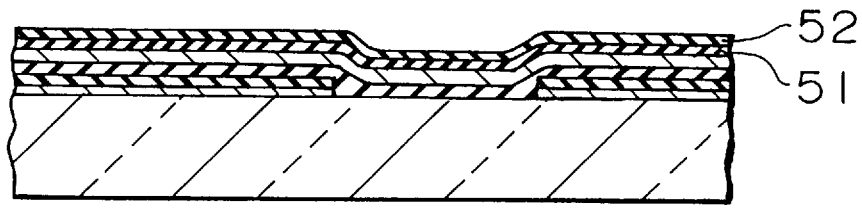
FIGS. 10A–10C are schematic sectional views (II) illustrating the LCD manufacturing method.

As shown in FIG. 10A, a second silicon oxide film 51 is formed, by high temperature treatment, to a thickness of 50 nm on the polycrystalline silicon film 42 having a large gain size, and a second silicon nitride film 52 is formed on the second silicon oxide film 51. High temperature treatment is performed by annealing at 1000° C. in an $O_2$ atmosphere for 60 minutes and a nitrogen atmosphere for 20 minutes. The second silicon nitride film 52 is formed to a thickness of 100 nm by the CVD method using $SiH_4$, $NH_3$ and $N_2$ as reaction gases.

Figure 10B:
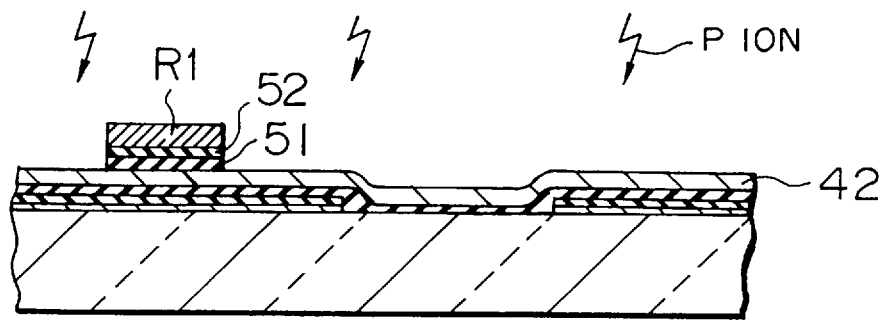

As shown in FIG. 10B, resist R1 for forming the LDD region is formed, and the second silicon oxide film 51 and the second silicon nitride film 52 are removed by predetermined photolithography, followed by post-baking and then phosphorus ion implantation.

At this time, the second silicon oxide film 51 is removed by wet etching with a HF aqueous solution, and the second silicon nitride film 52 is removed by dry etching with $CF_4$. Phosphorus ions are implanted in a low dose of $10^{12}$ to $10^{13}$ cm$^{-2}$ with an energy of 30 keV.

Figure 10C:
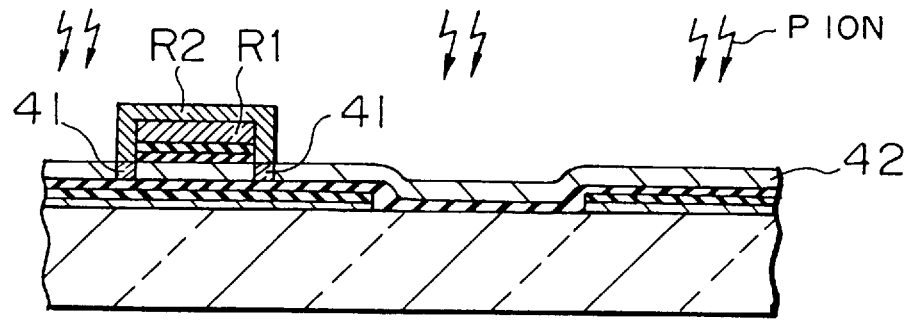

As shown in FIG. 10C, resist R2 is formed for forming the source region and the drain region so as to surround the resist R1, followed by phosphorus ion implantation. Phosphorus ions are implanted in a high dose of $10^{15}$ cm$^{-2}$ with an energy of 50 keV. At this time, a portion masked with the resist R2 outside the resist R1 serves as the LDD region 41.

Figure 11A:
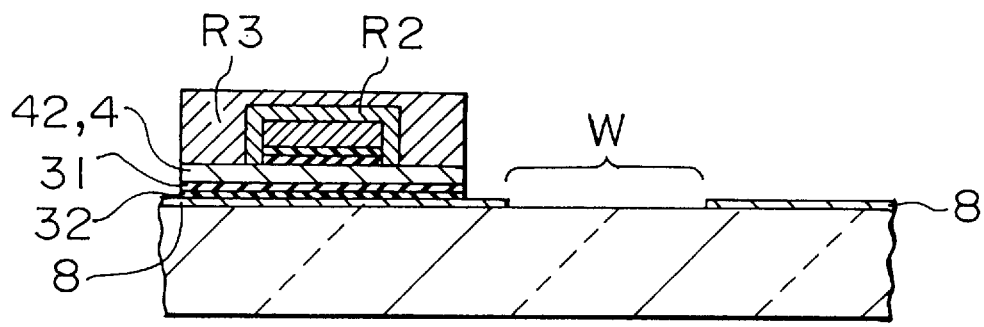
FIGS. 11A–11C are schematic sectional views (III) illustrating the LCD manufacturing method.

As shown in FIG. 11A, resist R3 is formed so as to surround the resist R2, and the polycrystalline silicon film 42, the first silicon oxide film 31 and the first silicon nitride film 32 are etched to form opening W for a pixel. Namely, the polycrystalline silicon film 42 and the first silicon nitride film 32 are removed by dry etching with $CF_4$, and the first silicon oxide film 31 is removed by wet etching with a HF aqueous solution. The resists R1, R2 and R3 are then removed by cleaning with an aqueous sulfuric acid solution. The active layer 4 comprising the LDD region, the source region and the drain region which are implanted with phosphorus ions is activated by heat treatment in a nitrogen atmosphere at 1000° C. for 5 to 10 minutes.

Figure 11B:
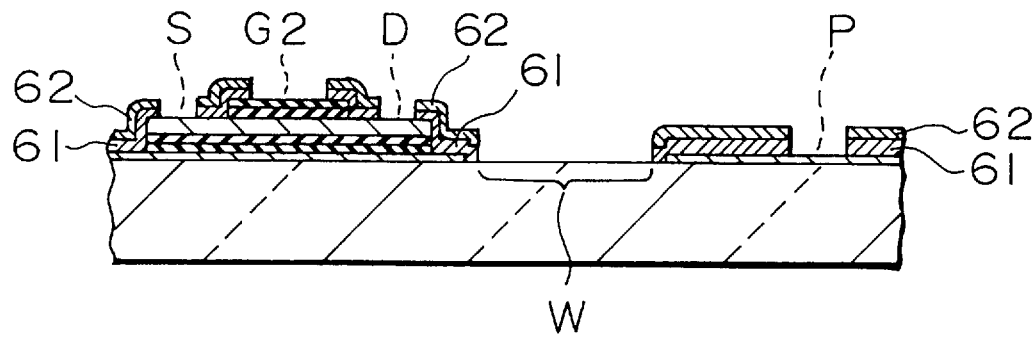

As shown in FIG. 11B, PSG 61 and a silicon nitride film 62 are formed, and subjected to hydrogenation annealing, and openings are formed in portions corresponding to the opening W, an external lead-out electrode pad P, the source S, the second gate electrode G2 and the drain electrode D.

Figure 11C:
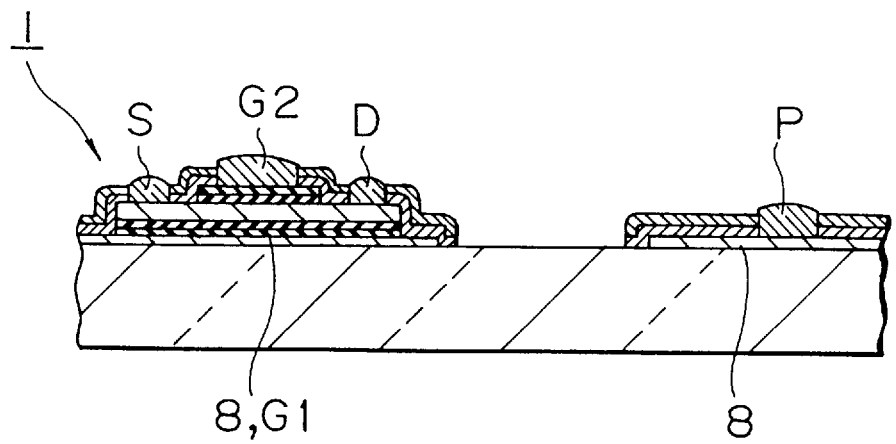

As shown in FIG. 11C, aluminum containing 1% Si is deposited to a thickness of 500 nm in the openings by sputtering, and etched to form the electrode pad, the source electrode S, the second gate electrode G2, and the drain electrode D. After each of the aluminum electrodes is formed, aluminum is sintered by heat treatment in a forming gas at 400° C. for 1 hour.

These electrodes are formed to complete the semiconductor device 1. In the semiconductor device 1, the $n^+$ polycrystalline silicon film 8 functions as the first gate electrode G1. The $n^+$ polycrystalline silicon film 8 is conductive with the external lead-out electrode pad P so that a voltage can be applied to the $n^+$ polycrystalline silicon film 8 serving as the first gate electrode G1.

Figure 12A:
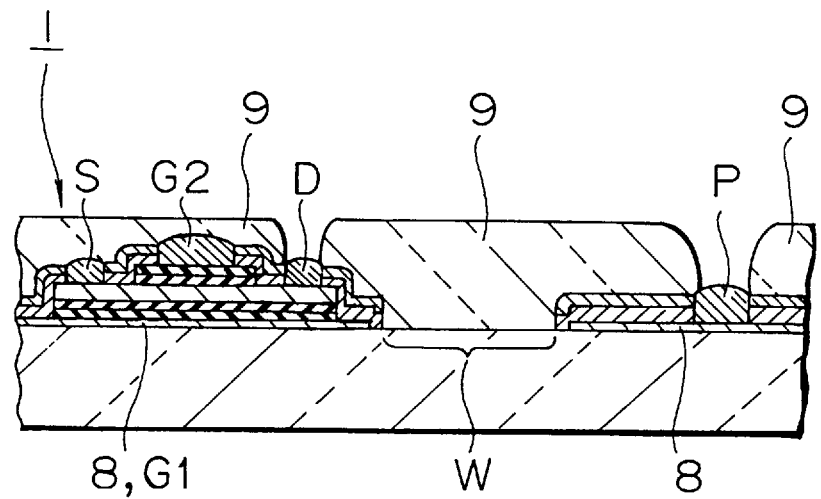
FIGS. 12A and 12B are schematic sectional views (IV) illustrating the LCD manufacturing method.

As shown in FIG. 12A, a flattening film 9 is formed so as to cover the semiconductor device 1 and the opening W. The flattening film 9 is formed by coating a photosensitive acrylic transparent resin to a thickness of about 2 $\mu$m, followed by mask exposure, development and post-baking (in a nitrogen atmosphere at 200° C. for 3 hours). Openings are formed in portions corresponding to the drain electrode D and the external lead-out electrode pad P.

Figure 12B:
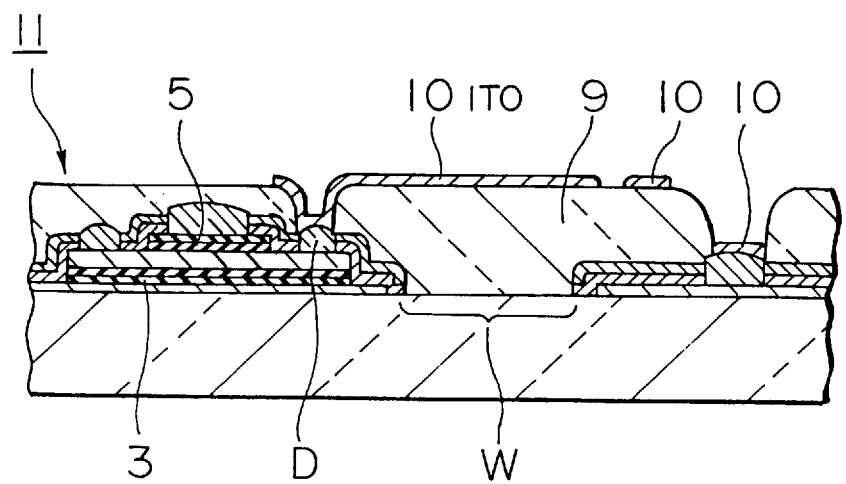

As shown in FIG. 12B, ITO 10 is formed as a pixel electrode on the flattening film 9 formed on the opening W. The ITO 10 is formed to a thickness of 0.12 to 0.15 $\mu$m by sputtering, and then etched to leave a necessary portion thereof. Vacuum heat treatment at 200° C. for 1 hour is then performed to complete a liquid crystal driving device 11.

Figure 13:
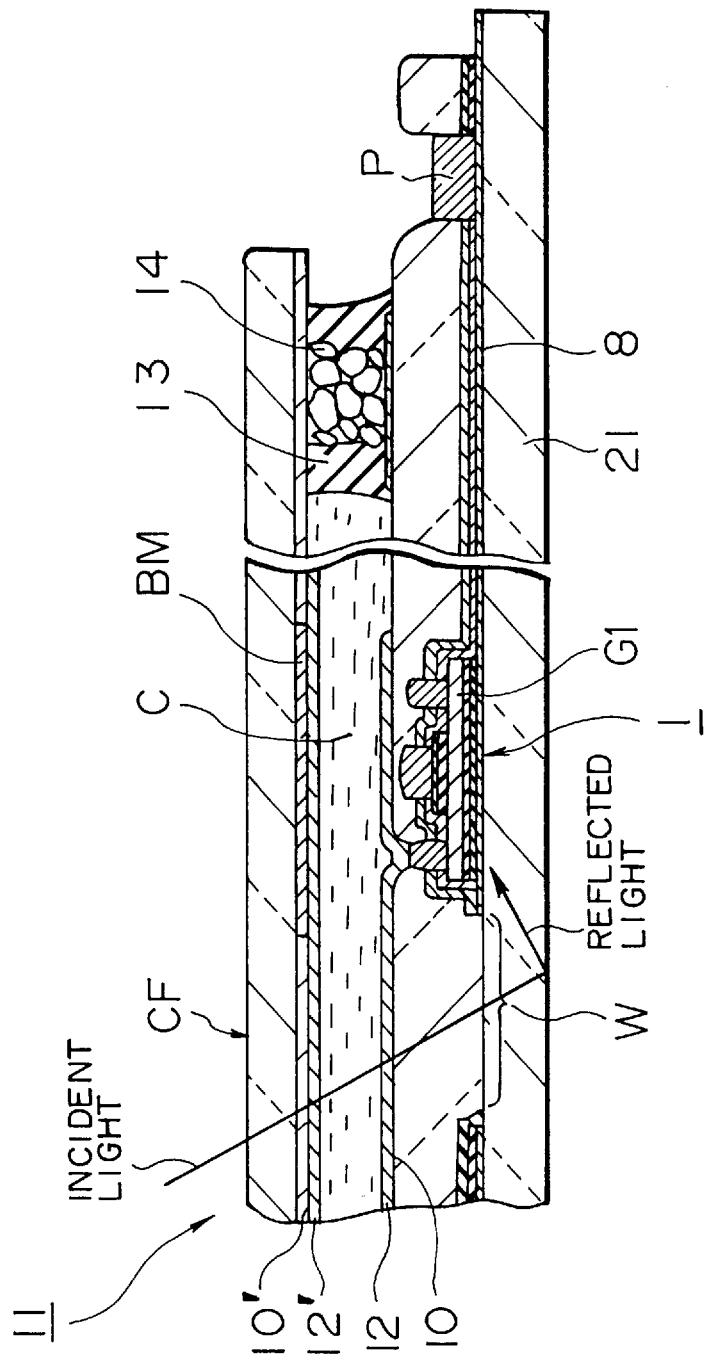
FIG. 13 is a schematic sectional view illustrating a combination state.

In fact, the liquid crystal driving device 11 is combined with a color filter substrate CF to form LCD, as shown in FIG. 13. The LCD comprises the liquid crystal driving device 11 and the color filter substrate CF which are combined through a sealer 13 (epoxy or acrylic ultraviolet irradiation/heat curing adhesive) therebetween, and a liquid crystal C sealed between an oriented film 12 provided on the side of the liquid crystal driving device 11 and an oriented film 12' provided on the side of the color filter substrate CF. ITO 10' provided on the side of the color filter substrate CF is conductive with the side of the liquid crystal driving device 11 through a common electrode 14.

In the LCD comprising the liquid crystal driving device 11 of this embodiment, even if light indicent to the side of the color filter substrate CF is reflected by the back side of the quartz glass substrate 21 on the side of the liquid crystal driving device 11, the reflected light is absorbed by the $n^+$ polycrystalline silicon film 8 and does not enter the semiconductor device 1, thereby producing no leak current between the drain and the source.

Namely, even if strong incident light enters the liquid crystal driving device 11, and part (particularly, blue light having short wavelengths) of the incident light enters as reflected light the semiconductor device 11, the reflected light is absorbed by the $n^+$ polycrystalline silicon film 8 to produce pairs of electrons and holes. At this time, when the $n^+$ polycrystalline silicon film 8 provided on the lower side of the semiconductor device 1 is set to a fixed potential (for example, zero potential or negative potential), no leak current occurs due to the reflected light. Therefore, the potential of the first gate electrode G1 the $n^+$ polycrystalline silicon film 8 is not changed by the incident light. For example, even if part of the reflected light enters the active layer 4, it is possible to prevent an increase in the leak current between the drain and the source and a decrease in drain voltage resistance.

When the semiconductor device 1 is manufactured by a low-temperature (about 400° C. or lower) process, a metallic opaque conductive thin film may be used in place of the $n^+$ polycrystalline silicon film 8. Probable examples of raw materials for the metallic opaque conductive thin film include Mo/Ta alloys, Cr, CrO/Cr thin films, Ti, TiN, W and WN.

The use of such a metallic opaque conductive thin film can prevent incidence of the reflected light to the semiconductor device 1 by cutting off the reflected light from the side of the liquid crystal driving device 11. This can prevent the occurrence of the leak current between the drain and the source.

In the liquid crystal driving device 11 of this embodiment, since portions other than the opening W are covered with the $n^+$ polycrystalline silicon film 8 or the metallic opaque conductive thin film, the semiconductor device 1 can be protected from electrostatic damage in various steps such as rubbing, dicing, bonding of a film, etc. in the process of manufacturing the semiconductor device 1 and the process of manufacturing the LCD. The semiconductor device 1 can be protected from electrostatic damage after the device 1 is incorporated as LCD into an electronic apparatus or the like.

Possible examples of materials for the first and second insulating layers 3 and 5 in the liquid crystal driving device 11 other than the above described materials include the following.

(1) The first insulating layer 3 comprises a silicon nitride film and a silicon oxide film in this order from the side of the first gate electrode G1, and the second insulating layer 5 comprises a silicon oxide film (single layer).

(2) The first insulating layer 3 comprises a silicon nitride film and a silicon oxide film in this order from the side of the first gate electrode G1, and the second insulating layer 5 comprises a silicon oxide film and a silicon nitroxide film in this order from the side of the active layer 4.

(3) The first insulating layer 3 comprises a silicon nitride film and a silicon oxide film in this order from the side of the first gate electrode G1, and the second insulating layer 5 comprises a silicon oxide film, a silicon nitroxide film and a silicon nitride film in this order from the side of the active layer 4.

(4) The first insulating layer 3 comprises a silicon nitride film and a silicon nitroxide film in this order from the side of the first gate electrode G1, and the second insulating layer 5 comprises a silicon oxide film (single layer).

(5) The first insulating layer 3 comprises a silicon nitride film and a silicon nitroxide film in this order from the side of the first gate electrode G1, and the second insulating layer 5 comprises a silicon oxide film and a silicon nitroxide film in this order from the side of the active layer 4.

(6) The first insulating layer 3 comprises a silicon nitride film, a silicon nitroxide film and a silicon oxide film in this order from the side of the first gate electrode G1, and the second insulating layer 5 comprises a silicon oxide film, a silicon nitroxide film and a silicon nitride film in this order from the side of the active layer 4.

Other materials having the effect of relieving layer stress and the metal antipollution effect can be applied.

From the viewpoint of prevention of $Na^+$ contamination from the quartz glass substrate 21, the first insulating layer 3 is preferably made thicker than the second insulating layer 5.

As described above, the present invention has the following effects. Since the gate electrodes are respectively provided above and below the active layer of the semiconductor device, it is possible to prevent the leak current between the drain and the source, and obtain a large driving current. Further, continuous film formation of the first insulating layer, the amorphous silicon film and the second insulating layer permits a decrease in error due to layer stress and dust particles.

In the liquid crystal driving device of the present invention, since the leak current between the drain and the source is not increased, the pixel potential (drain potential) is not decreased, thereby obtaining a high quality image without a decrease in contrast.

What is claimed is:

1. A semiconductor device comprising:

an active layer;

a first insulating layer on a first side of the active layer;

a second insulating layer on a second side of the active layer;

a first gate electrode and a second gate electrode, wherein at least a portion of the first insulating layer, active layer and second insulating layer are located between the first and second gate electrodes and wherein the active layer has LDD regions located at outer edges of the first gate electrode which do not extend over centers of the first gate electrode and second gate electrode.

2. A semiconductor device according to claim 1, wherein the first or second gate electrode is divided into a plurality of parts.

3. The semiconductor device of claim 1, wherein the LDD regions do not extend over or under either the first or second electrodes.

4. A liquid crystal driving apparatus comprising:

a semiconductor device for driving a liquid crystal and a pixel opening which are provided on a light-transmitting insulating substrate;

an opaque conductive film provided on a portion of the insulating substrate other than the pixel opening forming a second electrode;

a first insulating layer provided on a portion of the opaque conductive film at a location corresponding to the semiconductor device;

an active layer provided on the first insulating layer;

a second insulating layer provided on the active layer; and a first electrode provided on the second insulating layer, wherein the first electrode is separated from the second electrode by the first insulating layer, active layer and second insulating layer and wherein the active layer has LDD regions located at outer edges of the first gate electrode which do not extend over centers of the first gate electrode and second gate electrode.

5. The liquid crystal driving apparatus of claim 4, wherein the LDD regions do not extend over or under either the first or second electrodes.

* * * * *